(12) United States Patent
Koizumi

(10) Patent No.: US 6,420,790 B1
(45) Date of Patent: Jul. 16, 2002

(54) SEMICONDUCTOR DEVICE

(75) Inventor: Tsutomu Koizumi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/522,923

(22) Filed: Mar. 10, 2000

(30) Foreign Application Priority Data

Dec. 2, 1999 (JP) .......................................... 11-343176

(51) Int. Cl.[7] ........................ H01L 23/544; H01L 23/28
(52) U.S. Cl. ........................ 257/787; 257/797; 438/401; 438/462
(58) Field of Search ................................ 257/787, 797; 438/401, 462, 978

(56) References Cited

U.S. PATENT DOCUMENTS 5,569,879 A * 10/1996 Gloton et al. .............. 174/52.2
5,796,586 A * 8/1998 Lee et al. .................... 361/748

FOREIGN PATENT DOCUMENTS

| JP | 62-209148 | * | 8/1988 | .................. 257/787 |
| JP | 6-61373 | * | 3/1994 | .................. 257/797 |
| JP | 6-61374 | * | 3/1994 | |

* cited by examiner

Primary Examiner—Jasmine J B Clark
(74) Attorney, Agent, or Firm—Volentine Francos, PLLC

(57) ABSTRACT

A semiconductor device includes a substrate having electrodes, a semiconductor element mounted on the substrate and having electrode pads, wires for respectively connecting the electrodes of the substrate and the electrode pads of the semiconductor element, and an encapsulating resin for sealing the semiconductor element and the wires. Markings are provided on the semiconductor device so as to avoid areas of the surface of the encapsulating resin which correspond to the semiconductor element and the tops of the wires. Thus, when the markings are placed upon the surface of the encapsulating resin, a reduction in the strength of the encapsulating resin due to the markings can be avoided.

21 Claims, 4 Drawing Sheets

SEMICONDUCTOR DEVICE

BACKGROUND OF THE INVENTION

1. Field of the Invention

The present invention relates to a semiconductor device with marking placed thereon.

2. Description of the Related Art

Marking such as the name of a product, etc. have heretofore been placed on the surface of a resin after a semiconductor element has been sealed with the resin. Laser-based marking is now mainstream as a marking method because a processing speed for marking is fast.

SUMMARY OF THE INVENTION

An object of the present invention is to provide a marking form capable of, when marking are placed upon the surface of an encapsulating resin, controlling a reduction in the strength of the encapsulating resin due to the marking.

In order to achieve the above object, there is provided a semiconductor device according to the invention of the present application, comprising a substrate having electrodes, a semiconductor element mounted on the substrate and having electrode pads, wires for respectively connecting the electrodes of the substrate and the electrode pads of the semiconductor element, and an encapsulating resin for sealing the semiconductor element and the wires and wherein markings are placed on the surface of the encapsulating resin so as to avoid areas in the surface of the encapsulating resin which correspond to the semiconductor element and the tops of the wires.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

A first embodiment of the present invention will hereinafter be explained in detail with reference to FIGS. 1(A) and 1(B).

Figure 1A:
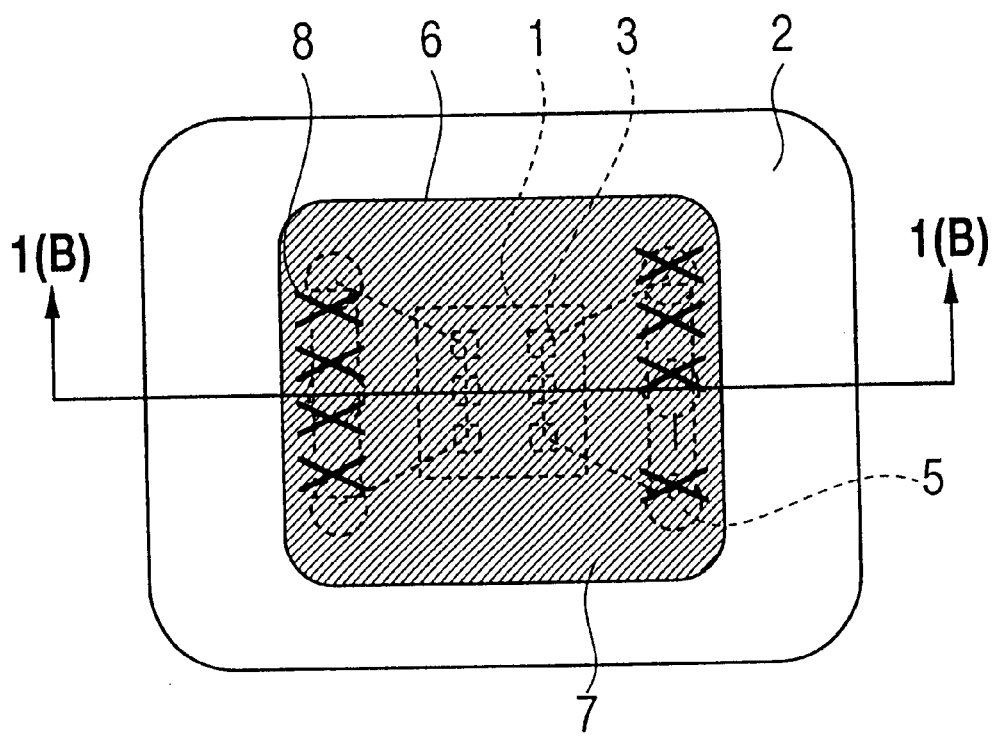
FIGS. 1(A) and 1(B) are a plan view and a cross-sectional view showing a first embodiment of the present invention.
Figure 1B:
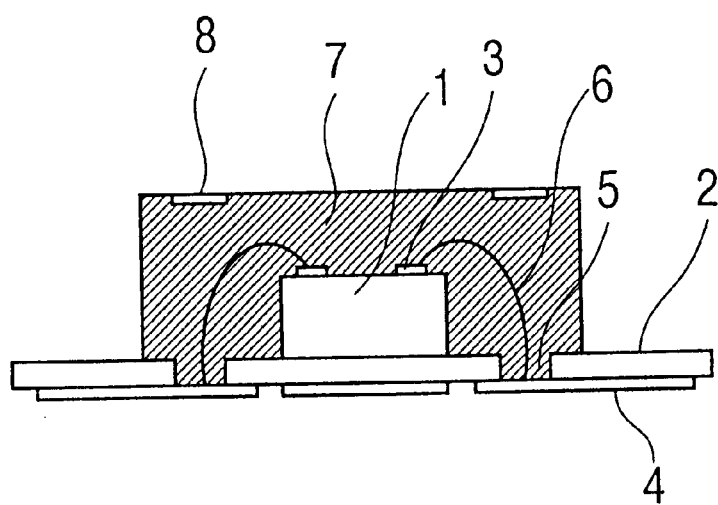

FIG. 1(A) is a plan view showing a semiconductor device according to the first embodiment of the present invention, and FIG. 1(B) is a cross-sectional view taken along line 1(B)—1(B) in FIG. 1(A).

Referring to FIG. 1, a semiconductor chip or element 1 is fixed to the surface of a substrate 2 with an unillustrated adhesive. The substrate 2 is composed of, for example, a glass epoxy resin or the like. A plurality of electrode pads 3 are formed over the surface of the semiconductor element 1.

External electrodes 4 are formed over the reverse side or back of the substrate 2. The external electrode 4 can be formed by bonding copper foil or the like to the substrate 2 and subjecting plating to the surface thereof. Apertures or openings 5 are defined in the substrate 2. The external electrodes 4 exposed through the openings 5 and the electrode pads 3 are respectively connected to one another by wires 6.

These semiconductor element 1 and wires 6 are encapsulated by a resin 7. Since it is desirable to thin the semiconductor device including the substrate 2 as a whole when they are employed in an IC card, the resin 7 cannot be formed thick. In the present embodiment, the thickness of the resin 7 formed over the semiconductor element 1 is about 0.2 mm.

After the semiconductor element 1 and the wires 6 have been sealed with the resin 7, marking 8 are respectively placed onto a region formed between the tops of loops of the wires 6 and one end of the resin 7 by means of a laser. Owing to the placing of the marking thereon, concave portions each having a depth of 10 $\mu$m or more as a depth discriminable from its periphery are formed over the surface of the resin 7. In the present invention, the top of each wire 6 means a portion of the wire 6 connecting between the electrode pad 3 and the external electrode 4 while being drawn in loop form, which portion is spaced farthest from the substrate, i.e., it means a portion thereof nearest to the surface of the resin 7.

The surface of the resin 7 is cut away over a depth of 10 $\mu$m or more when the marking are given by the laser. Thus, there is a possibility that this will exert an influence on the strength of the resin according to the positions where the marking are made. Namely, since the external electrodes 4 are used in contact with the outside in the IC card, for example, pressure is applied to the external electrodes 4. Therefore, when marking are placed on the semiconductor element 1 with the resin 7 thinnest in thickness or the tops of the wires 6, the resin 7 is considered to be most lowered in strength.

Thus, the placing of the marking on the surface of the resin 7 so as to avoid areas in the surface thereof corresponding to the semiconductor element 1 and the tops of the wires 6 makes it impossible to prevent a reduction in the strength of the resin 7.

When it is desired to provide marking in two rows, they are provided at both ends of an encapsulating resin separately or in parts. Such provision of the marking in two rows in parts makes it possible to place all the marking on the portion of the resin, which is thickest in thickness, whereby the strength of the resin can be further improved.

Figure 2A:
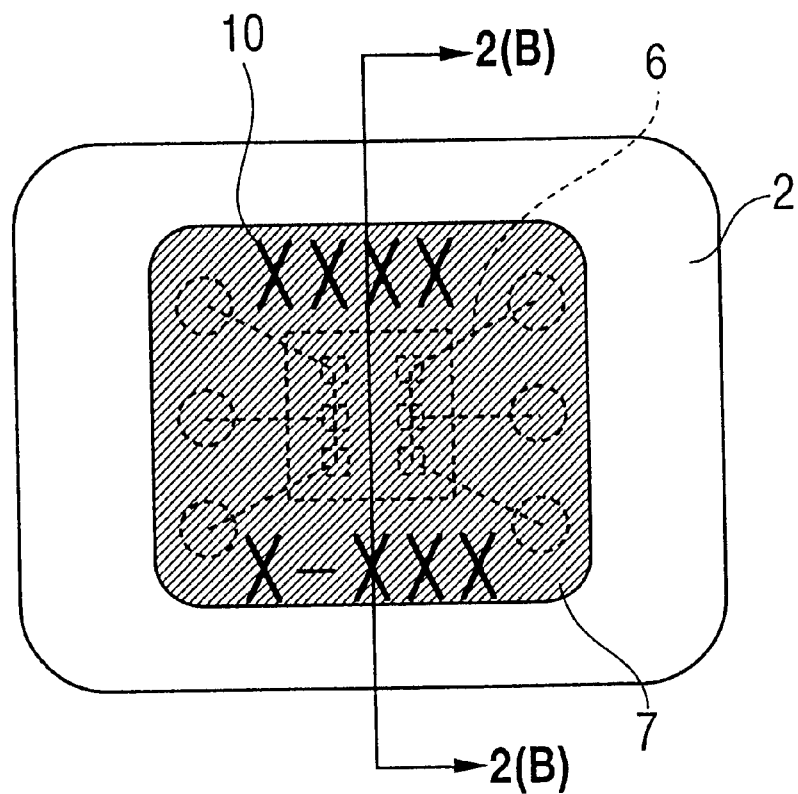
FIGS. 2(A) and 2(B) are a plan view and a cross-sectional view illustrating a second embodiment of the present invention.
Figure 2B:
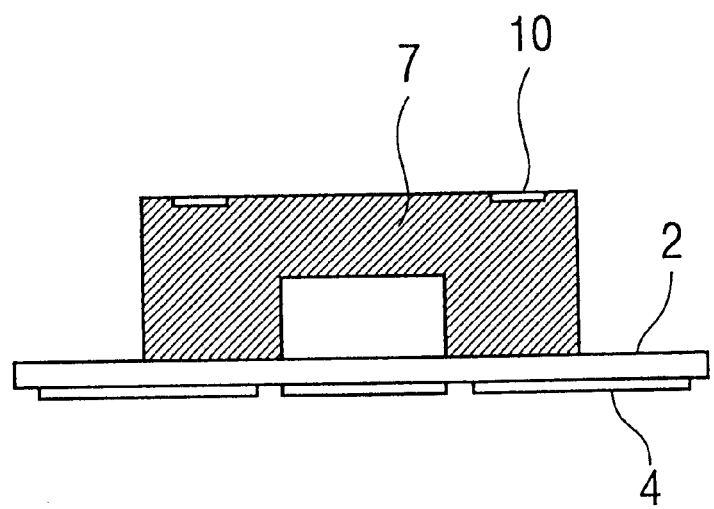

FIG. 2 is a view showing a second embodiment of the present invention, wherein FIG. 2(A) is a top view and FIG. 2(B) is a cross-sectional view taken along line 2(B)—2(B) in FIG. 2(A).

In the second embodiment of the present invention shown in FIG. 2, the same elements of structure as those employed in the first embodiment are identified by the same reference numerals.

The second embodiment is different from the first embodiment in positions on which marking 10 are placed. Namely, while the second embodiment is common to the first embodiment in that the marking are provided so as to avoid the wires 6 and the semiconductor element 1, it is different therefrom in that the marking 10 are provided along the sides of a resin which exist in a direction different from the direction in which the wires 6 are stretched. Even in the case of the present embodiment, the marking 10 are provided by cutting the surface of the resin 7 over a depth of 10 μm or more by a laser.

The provision of the marking along the sides of the resin on the side free from the stretching of the wires 6 in this way makes it possible to place the marking so as to avoid a portion thin in resin's thickness, whereby the strength of the resin can be maintained.

While the surface of the resin for encapsulation is generally shaped in satin finished, each marking becomes easy to read owing to the formation of the surface of the resin 7 as a mirror-finished surface in the first and second embodiments even if the digging-in depth of each marking by a laser is rendered shallow. The entire surface of the resin 7 may be used as a mirror-finished region. However, even in the case of only portions around the marking, their reading becomes easy.

Figure 3A:
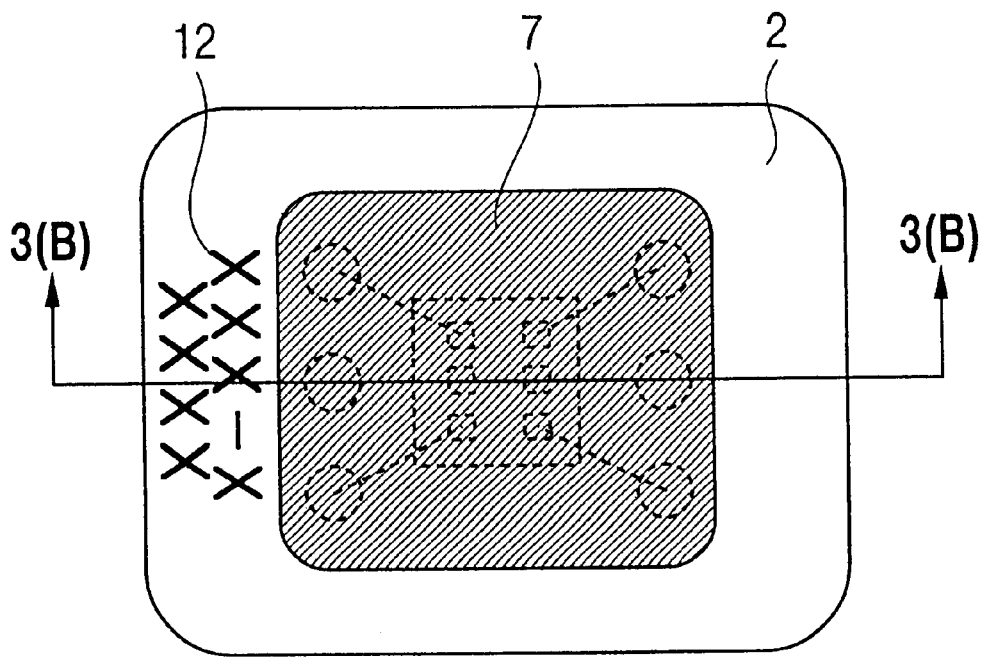
FIGS. 3(A) and 3(B) are a plan view and a cross-sectional view showing a third embodiment of the present invention.
Figure 3B:
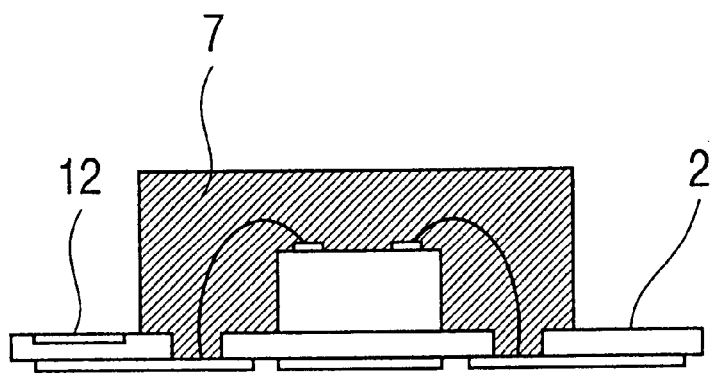

FIG. 3 is a view showing a third embodiment of the present invention, wherein FIG. 3(A) is a top view and FIG. 3(B) is a cross-sectional view taken along line 3(B)—3(B) in FIG. 3(A).

In the third embodiment of the present invention shown in FIG. 3, the same elements of structure as those employed in the first embodiment are identified by the same reference numerals.

The third embodiment is different from the first embodiment in that marking 12 are not placed on the surface of a resin 7 for encapsulation but on the surface of a substrate 2.

Thus, when a marking region is available within the surface of the substrate 2, it is possible to place the marking 12 on the surface of the substrate 2 without placing the marking on the surface of the resin 7.

In this case, no concave portions are defined in the surface of the resin 7 by the marking and hence the strength of the resin 7 is not lowered.

Figure 4A:
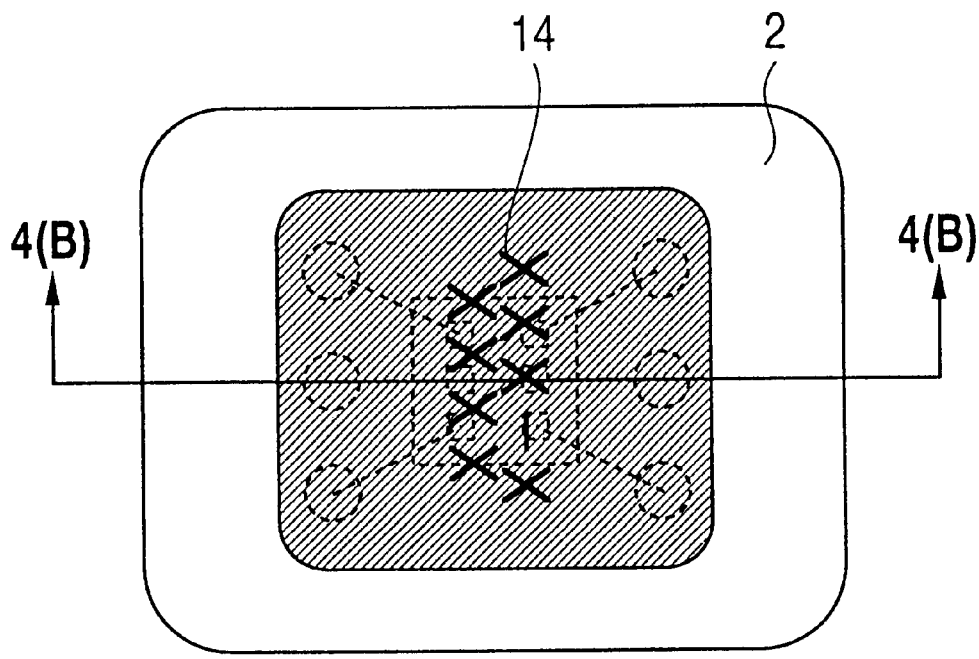
FIGS. 4(A) and 4(B) are a plan view and a cross-sectional view illustrating a fourth embodiment of the present invention.
Figure 4B:
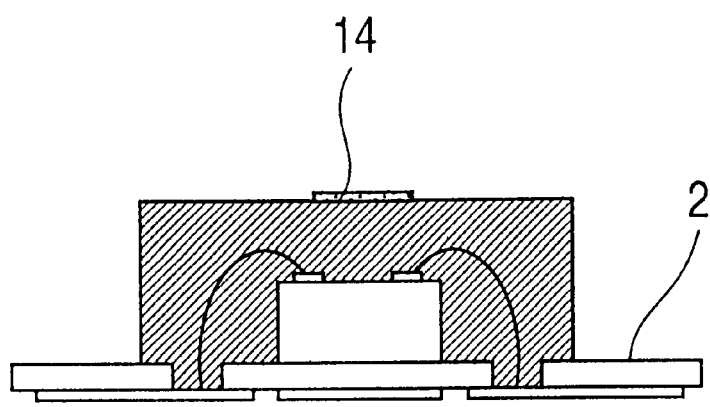

FIG. 4 is a view for describing a fourth embodiment of the present invention, wherein FIG. 4(A) is a top view, and FIG. 4(B) is a cross-sectional view taken along line 4(B)—4(B) in FIG. 4(A).

In the fourth embodiment of the present invention shown in FIG. 4, the same elements of structure as those employed in the first embodiment are identified by the same reference numerals.

The fourth embodiment is different from the first embodiment in a method of placing marking on the surface of a resin 7.

Namely, when there is no region for placing marking 14 on the surface of the resin 7, which avoids their placing to a semiconductor element 1 and wires 6, the marking 14 are attached thereto with ink other than by a laser. Incidentally, the ink-based marking means either ink-based transfer marking or print marking.

It is generally desirable to carry out marking by a laser in terms of a processing speed for marking. However, when the thickness of the resin on the semiconductor element 1 reaches 0.2 mm or less, the influence of concave portions by laser marking will not be negligible. Therefore, the ink-based marking becomes effective so long as the thickness of the resin formed over the semiconductor element 1 is less than or equal to 0.2 mm.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a substrate having a plurality of electrodes;
   a semiconductor chip mounted on said substrate and having a plurality of electrode pads;
   a plurality of wires each respectively having a first end connected to respective different ones of the electrodes of said substrate and a second end connected to respective different ones of the electrode pads of said semiconductor chip, each of said wires having a loop top between the first and second ends;
   an encapsulating resin that seals said semiconductor chip and said wires; and
   a mark formed on a surface of said encapsulating resin, said mark distinguishing the semiconductor device from other products and being arranged in an area of the surface of said encapsulating resin which is not located over said semiconductor chip and the loop tops of said wires.

2. A semiconductor device according to claim 1, wherein said mark is a laser produced mark.

3. A semiconductor device according to claim 1, wherein a depth of said mark is greater than or equal to 10 μm.

4. A semiconductor device according to claim 3, wherein the surface of said encapsulating resin is a mirror finished surface.

5. A semiconductor device, comprising:
   a semiconductor chip to which wires are bonded, said semiconductor chip being sealed with an encapsulating resin which has a surface; and
   a plurality of concave portions formed on the surface of said encapsulating resin, said concave portions distinguishing the semiconductor device from other products and being arranged in an area of the surface of said encapsulating resin which is not located over said semiconductor chip and tops of the wires.

6. A semiconductor device according to claim 5, wherein said concave portions have a form distinctive of a product name.

7. A semiconductor device according to claim 5, wherein said concave portions are laser formed concave portions.

8. A semiconductor device, comprising:
   a semiconductor chip to which wires are bonded, said semiconductor chip being sealed with an encapsulating resin which has a surface; and
   a marked formed on the surface of said encapsulating resin, said mark distinguishing the semiconductor device from other products and being arranged in an area of the surface of said encapsulating resin which is not located over tops of the wires and said semiconductor chip.

9. A semiconductor device according to claim 8, wherein said mark comprises concave portions defined in the surface of said encapsulating resin.

10. A semiconductor device, comprising:
- a substrate having a surface, a back opposite to the surface, and a plurality of openings formed therethrough;
- a plurality of external electrodes formed from the surface of said substrate through the openings to the back of said substrate, so that parts of said electrodes are exposed at the back of said substrate;
- a semiconductor chip mounted on the back of said substrate, said semiconductor chip having a plurality of electrode pads formed on a surface thereof;
- a plurality of wires connecting said external electrodes and said electrode pads of said semiconductor chip;
- an encapsulating resin that seals said semiconductor chip and said wires; and
- a mark formed on a peripheral surface area of said encapsulating resin.

11. A semiconductor device according to claim 10, wherein the peripheral surface area of said encapsulating resin is not located over tops of said wires and said semiconductor element.

12. A semiconductor device according to claim 11, wherein said mark comprises concave portions defined in a surface of said encapsulating resin.

13. A semiconductor device, comprising:
- a substrate having a surface;
- a semiconductor chip mounted on the surface of said substrate; and
- an encapsulating resin that seals said semiconductor chip, wherein a peripheral area of the surface of said substrate is exposed so as not to be sealed with said encapsulating resin; and
- a marking formed on the exposed surface of said substrate.

14. A semiconductor device according to claim 13, further comprising external electrodes formed over a back surface of said substrate opposite to the surface of said substrate, said semiconductor chip being electrically connected to said external electrodes through openings defined in said substrate.

15. A semiconductor device according to claim 13, wherein said marking distinguishes the semiconductor device from other products.

16. A semiconductor device according to claim 14, wherein said external electrodes and said semiconductor chip are electrically connected to each other by wires.

17. A semiconductor device, comprising:
- a semiconductor element having electrode pads formed on a surface thereof; and
- an encapsulating resin for sealing the surface of said semiconductor element,
- wherein a thickness of said encapsulating resin on the surface of said semiconductor element is less than or equal to 0.2 mm, and a marking placed on a surface of said encapsulating resin is formed with ink.

18. A semiconductor device, comprising:
- a substrate having a surface and a back;
- a semiconductor chip mounted on the surface of said substrate;
- an encapsulating resin that seals said semiconductor chip; and
- a mark formed on a surface of said encapsulating resin, said mark distinguishing the semiconductor device from other products and being arranged on a peripheral surface area of said encapsulating resin which is not located over said semiconductor chip.

19. A semiconductor device according to claim 18, wherein said mark is a laser formed mark.

20. A semiconductor device according to claim 18, wherein a depth of said mark is greater than or equal to 10 μm.

21. A semiconductor device according to claim 18, wherein external electrodes are formed over the back of said substrate.

* * * * *